(12) United States Patent
Toyao et al.

(10) Patent No.: US 8,873,246 B2
(45) Date of Patent: Oct. 28, 2014

(54) ELECTRONIC DEVICE, WIRING BOARD, AND METHOD OF SHIELDING NOISE

(75) Inventors: Hiroshi Toyao, Tokyo (JP); Manabu Kusumoto, Tokyo (JP); Naoki Kobayashi, Tokyo (JP); Noriaki Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 226 days.

(21) Appl. No.: 13/583,884

(22) PCT Filed: Feb. 18, 2011

(86) PCT No.: PCT/JP2011/000909
§ 371 (c)(1),
(2), (4) Date: Sep. 10, 2012

(87) PCT Pub. No.: WO2011/111313
PCT Pub. Date: Sep. 15, 2011

(65) Prior Publication Data
US 2013/0003333 A1    Jan. 3, 2013

(30) Foreign Application Priority Data

Mar. 8, 2010    (JP) ................................. 2010-051083

(51) Int. Cl.
*H05K 7/00* (2006.01)
*H05K 1/16* (2006.01)
*H05K 1/02* (2006.01)
*H05K 1/11* (2006.01)

(52) U.S. Cl.
CPC ...... *H05K 1/0236* (2013.01); *H05K 2201/0979* (2013.01); *H05K 1/162* (2013.01); *H05K 2201/10371* (2013.01); *H05K 2201/09663* (2013.01); *H05K 1/165* (2013.01); *H05K 1/0218* (2013.01); *H05K 1/116* (2013.01); *H05K 2201/0969* (2013.01); *H05K 2201/09618* (2013.01); *H05K 2201/09309* (2013.01); *H05K 2201/10674* (2013.01); *H05K 1/0243* (2013.01); *H05K 1/0298* (2013.01)
USPC ............ 361/777; 361/807; 361/760; 361/748

(58) Field of Classification Search
USPC .................................. 361/777, 760, 748, 807
See application file for complete search history.

(56) References Cited

U.S. PATENT DOCUMENTS

| 6,262,495 B1 | 7/2001 | Yablonovitch et al. |
| 2010/0172116 A1* | 7/2010 | Yorita et al. ................... 361/816 |
| 2010/0181100 A1* | 7/2010 | Nakano et al. ................ 174/251 |

FOREIGN PATENT DOCUMENTS

| JP | 7-263908 A | 10/1995 |
| JP | 2006-253929 A | 9/2006 |
| JP | 2007-88102 A | 4/2007 |

(Continued)

*Primary Examiner* — Andargie M Aychillhum
(74) *Attorney, Agent, or Firm* — Foley & Lardner LLP

(57) ABSTRACT

A wiring board includes a metal cap pad that is arranged so as to surround a mounting position of an electronic component and is connected to an end portion of a metal cap, a power source plane that is connected to the electronic component through a connection member and has a gap, a ground plane that is connected to the electronic component through a connection member, and a plurality of conductive body elements that are repeatedly arranged so as to surround the connection members and the gap. The power source plane and the ground plane extend so as to include at least a part of an area that is surrounded by the plurality of conductive body elements and at least a part of an area facing the plurality of conductive body elements.

11 Claims, 18 Drawing Sheets

(56) References Cited

FOREIGN PATENT DOCUMENTS

| JP | 2007-165857 A | 6/2007 |
| JP | 2009-32907 A | 2/2009 |
| JP | 2009-111132 A | 5/2009 |

\* cited by examiner (A)

(B)

(A)

(B)

(A)

(B)

(A)

(B)

(A)

(B)

(A)

(B)

(C)

(A)

(B)

ELECTRONIC DEVICE, WIRING BOARD, AND METHOD OF SHIELDING NOISE

This application is the National Phase of PCT/JP2011/000909, filed Feb. 18, 2011, which claims priority to Japanese Application No. 2010-051083, filed Mar. 8, 2010, the disclosures of which are hereby incorporated by reference in their entirety.

TECHNICAL FIELD

The present invention relates to an electronic device, a wiring board, and a method of shielding a noise.

BACKGROUND ART

In an electronic device, there are cases where a noise generated from an electronic component propagates through a parallel flat plane that is formed by a power source-ground plane as a kind of a waveguide so as to have an adverse influence on the other electronic components, a wireless circuit located close thereto, or the like. Therefore, countermeasures for the noise are generally taken, and many techniques have been developed.

Recently, it has been disclosed that the propagation characteristics of electromagnetic waves can be controlled by periodically arranging a conductive body pattern having a specific structure. Particularly, a meta material configured so as to suppress the propagation of electromagnetic waves in a specific frequency band is called an electronic band gap structure (hereinafter, referred to as an EBG structure), and a countermeasure for noise using the EBG structure has attracted attention.

As a technique of such a type, for example, there is a technique described in Patent Document 1 (U.S. Pat. No. 6,262,495 Specification). In FIG. 2 of Patent Document 1, a structure, that is, a so-called EBG structure of a mushroom type is illustrated, in which a plurality of island-shaped conduction elements is arranged on the upper side of a sheet-shaped conduction plane, and each of the island-shaped conduction elements is connected to the conduction plane through a via.

In addition, as a technique of such a type, there is a technique disclosed in Patent Document 2 (Japanese Patent Application Laid-Open No. 2006-253929). In FIG. 4 of Patent Document 2, an EBG structure that is configured by connecting two conductive bodies facing each other is illustrated. In addition, the inductance component of a conductive body that is formed in a lower level out of the two conductive bodies facing each other is increased by applying a conductive body pattern for which a large reflection coefficient is acquired in a Bragg frequency.

RELATED DOCUMENT

Patent Document

[Patent Document 1] U.S. Pat. No. 6,262,495 Specification
[Patent Document 2] Japanese Patent Application Laid-Open No. 2006-253929

DISCLOSURE OF THE INVENTION

In the case of an electronic device having multiple layers, noise propagates from an electronic component to a wiring or a parallel flat plates having an electric potential difference therebetween. In addition, in a case where there is a hole or a gap in the parallel flat plates, the leakage of noise from the gap needs to be considered. In addition, in a case where an electronic component is mounted on one face of the multi-layer board, noise propagating from the electronic component to the air or noise propagating on one face, that is, a so-called surface wave needs to be considered. Thus, in the case of the above-described electronic device, by simply configuring only the EBG structure, an adequate countermeasure cannot be achieved.

The present invention is devised in view of the above-described circumstances, and the object thereof is to provide an electronic device, a wiring board, and a method of shielding a noise that are capable of sufficiently preventing the leakage of a noise propagating from a mounted electronic component.

According to the present invention, there is provided an electronic device including: a wiring board that includes a plurality of layers; an electronic component that is mounted on one face of the wiring board; and a metal cap that covers the electronic component, wherein the wiring board includes: a first conductive body that is located on the one face, is arranged so as to surround the electronic component, and is connected to an end portion of the metal cap; a second conductive body that is located in a first layer, is connected to the electronic component through a first connection member, and has a gap; a third conductive body that is located in a second layer facing the one face through the first layer and is connected to the electronic component through a second connection member; and a plurality of fourth conductive bodies that are repeatedly arranged so as to surround the first connection member, the second connection member and the gap, wherein the second conductive body and the third conductive body extend so as to include at least a part of an area that is surrounded by the plurality of fourth conductive bodies and at least a part of an area facing the plurality of fourth conductive bodies in the plan view.

In addition, according to the present invention, there is provided a wiring board including: a first conductive body that is located on one face, is arranged so as to surround a mounting area of an electronic component, and is connected to an end portion of a metal cap; a second conductive body that is located in a first layer, is connected to the electronic component through a first connection member, and has a gap; a third conductive body that is located in a second layer facing the one face through the first layer and is connected to the electronic component through a second connection member; and a plurality of fourth conductive bodies that are repeatedly arranged so as to surround the first connection member and the second connection member, wherein the second conductive body and the third conductive body extend so as to include at least a part of an area that is surrounded by the plurality of fourth conductive bodies and at least a part of an area facing the plurality of fourth conductive bodies in the plan view.

Furthermore, according to the present invention, there is provided a method of shielding a noise that is used for shielding the noise that is generated by an electronic component mounted on one face of a wiring board including: shielding a noise propagating from the electronic component to the air using a metal cap that covers the electronic component; shielding a noise propagating above the surface of one face using a first conductive body that is located on the one face, is arranged so as to surround the electronic component, and is connected to an end portion of the metal cap; shielding a noise propagating between a second conductive body that is located in a first layer, is connected to the electronic component through a first connection member, and has a gap and a third conductive body that is located in a second layer facing the one face through the first layer and is connected to the electronic component through a second connection member, in an area in which a plurality of fourth conductive bodies that are repeatedly arranged so as to surround the first connection member and the second connection member face at least one of the second conductivity body or the third conductivity body; and shielding a noise that propagates between the second conductive body and the third conductive body and further leaks from the gap using an area in which the plurality of fourth conductive bodies face at least one of the first conductive body and the second conductive body or the metal cap.

According to the present invention, an electronic device, a wiring board, and a method of shielding a noise that are capable of preventing the leakage of a noise propagating from a mounted electronic component are provided.

DESCRIPTION OF EMBODIMENTS

Figure 1:
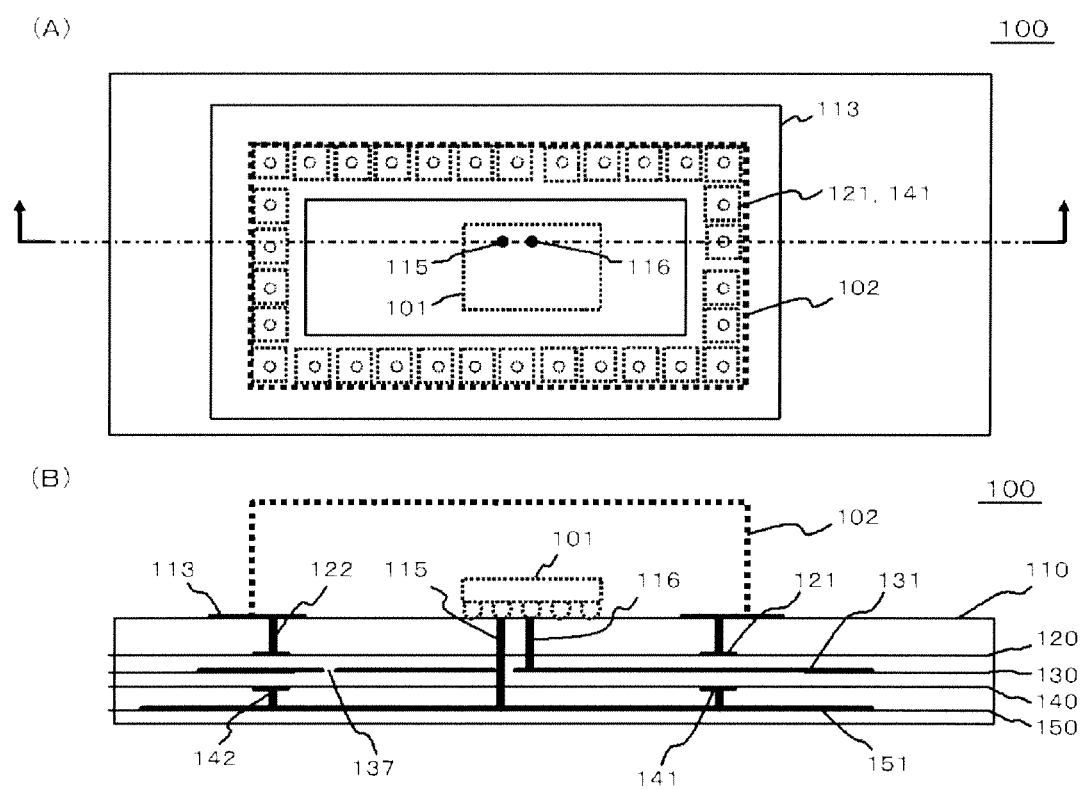
FIG. 1 represents a top view and a cross-sectional view of a wiring board according to a first embodiment of the present invention.

Hereinafter, embodiments of the present invention will be described with reference to the drawings. In all the drawings, the same reference numeral is assigned to the same constituent elements, and the description thereof will not be presented as is appropriate.

First Embodiment

FIG. 1 represents a top view and a cross-sectional view of a wiring board 100 according to a first embodiment of the present invention. Described in more detail, FIG. 1(A) is a top view of the wiring board 100, and FIG. 1(B) is a cross-sectional view of the wiring board 100 that is taken along a cross-section line represented in FIG. 1(A). The wiring board 100 is a multi-layer board that includes at least an A layer 110, a B layer 120, a C layer 130, a D layer 140, and an E layer 150 facing one another. In addition, the wiring board 100 may further include a layer other than the above-described five layers. For example, a dielectric layer may be located between the layers. Furthermore, the wiring board 100 may further include a hole, a via, or the like that is not shown in the diagrams in a range not contradicting the configuration of the present invention. In addition, in the above-described five layers, signal lines may be arranged in a range not contradicting the configuration of the present invention.

In addition, in FIG. 1, an electronic component 101 and a metal cap 102 are denoted by broken lines. This represents that the electronic component 101 and the metal cap 102 are not mounted. In other words, in the A layer 110 that is the surface layer of the wiring board 100, a mounting area in which the electronic component 101 and the metal cap 102 are to be mounted is arranged. Here, as the electronic component 101, a component such as an LSI is assumed. In addition, the number of electronic components 101 that are mounted on the wiring board 100 may be one or more.

In a case where the electronic component 101 is mounted, a connection member 116 (first connection member) connects the electronic component 101 and a power source plane 131 that is located on the C layer 130. Here, although only one connection member 116 that is connected to the electronic component 101 is illustrated in the diagram, a plurality of connection members may be arranged.

In a case where the electronic component 101 is mounted, a connection member 115 (second connection member) connects the electronic component 101 and a ground plane 151 that is located on the E layer 150. Here, although only one connection member 115 that is connected to the electronic component 101 is illustrated in the diagram, a plurality of connection members may be arranged.

The metal cap pad 113 (first conductive body) is located on the A layer 110 (one face) and surrounds the connection member 115 and the connection member 116. In addition, the metal cap 102 is mounted on the wiring board 100 by being connected to the metal cap pad 113 using solder or the like.

In addition, in FIG. 1(A), conductive body elements 121 and 141 are located on a layer that is lower than the surface layer, and accordingly, the conductive body elements 121 and 141 are denoted by broken lines, the positions of both elements overlap each other in the plan view, and accordingly, the conductive body elements 121 and 141 are denoted by one rectangle. Furthermore, the conductive body element 121 and the conductive body element 141 need not necessarily be arranged at positions overlapping each other in the plan view but may be arranged such that at least parts thereof face each other. In addition, the shape of the conductive body element 121 or the conductive body element 141 is not limited to a rectangle but may be a triangle, a hexagon, or the like.

Figure 2:
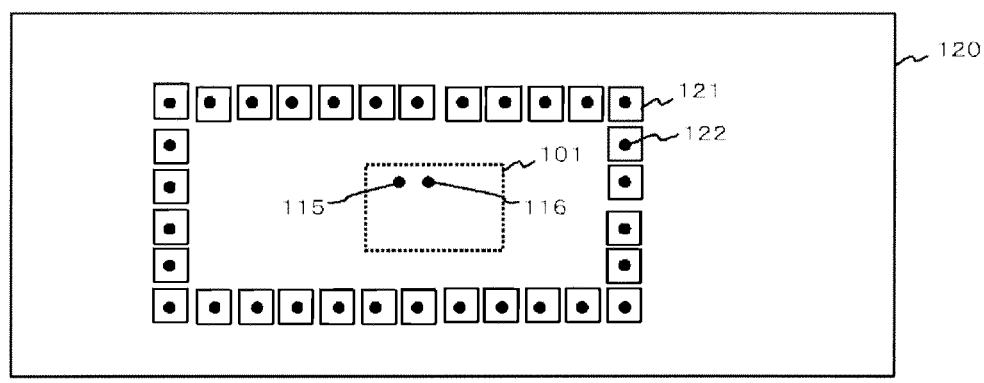
FIG. 2 is a diagram that illustrates a B layer and a D layer of the wiring board.
Figure 2:
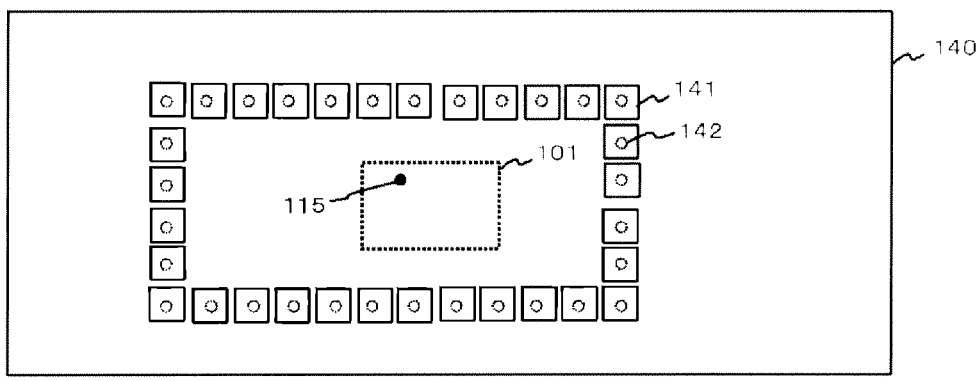
Figure 3:
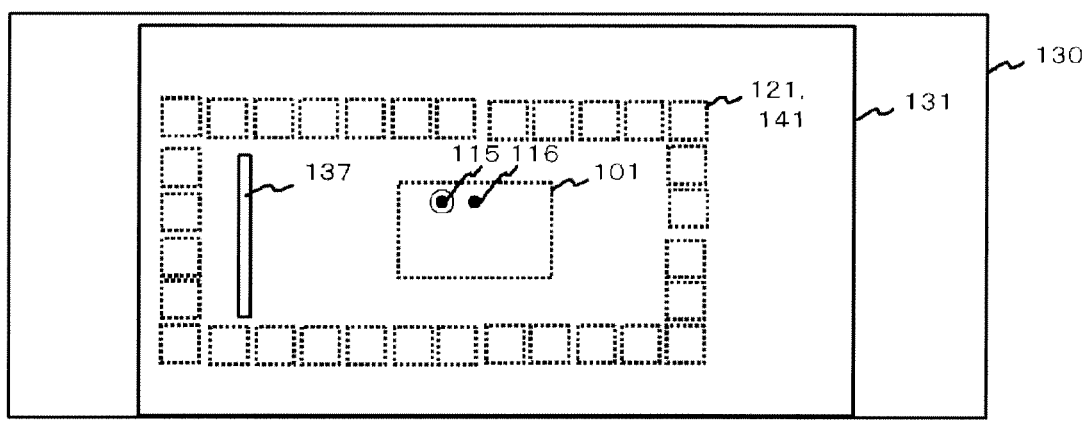
FIG. 3 is a diagram that illustrates a C layer of the wiring board.

FIG. 2 is a diagram that illustrates the B layer 120 and the D layer 140 of the wiring board 100. In the B layer 120, a plurality of conductive body elements 121 (fourth conductive body) is repeatedly arranged so as to surround the connection member 115, the connection member 116, and a gap 137. In addition, in the D layer 140, a plurality of conductive body elements 141 (fourth conductive body) is repeatedly arranged so as to surround the connection member 115, the connection member 116, and the gap 137. The positional relation between the plurality of conductive body elements 121 (or the conductive body elements 141) and the gap 137 is illustrated in FIG. 3 to be described later.

Here, the conductive body elements 121 are island-shaped conductive bodies that are arranged so as to be separate from each other. In addition, the conductive body elements 141 are island-shaped conductive bodies that are arranged so as to be separate from each other. An area of the B layer 120 in which the conductive body elements 121 are not arranged and an area of the D layer 140 in which the conductive body elements 141 are not arranged are formed as insulating bodies and are insulated by using the connection member 115 or the like.

Here, surrounding the connection members 115 and 116 and the gap 137 by the conductive body elements 121 (or the conductive body elements 141) means surrounding the position of the connect ion members 115, the position of the connection member 116, and the position of the gap 137 are surrounded in the plan view. In addition, being repeatedly arranged means that at least three or more conductive body elements 121 and 141 are consecutively arranged separate from each other. Since the conductive body elements 121 and 141 are separate from each other, the entirety of the connection member 115 in the plane direction is not surrounded in a strict sense. A gap between the conductive body elements 121 and a gap between the conductive body elements 141 may be determined such that a noise of a frequency band that is a suppression target can be sufficiently suppressed.

Each conductive body element 121 is connected to the metal cap pad 113 through the connection member 122, and each conductive body element 141 is connected to the ground plane 151 through the connection member 142. In addition, the conductive body element 121 does not need to be necessarily connected to the metal cap pad 113. The conductive body element 141 does not need to be necessarily connected to the ground plane 151.

FIG. 3 is a diagram that illustrates the C layer 130 of the wiring board 100. In the C layer 130, a power source plane 131 is disposed, and the power source plane 131 has a gap 137. In the power source plane 1311, an opening through which the connection member 115 passes through is disposed and is insulated from the connection member 115. In addition, in the diagram, although the entirety of the gap 137 is illustrated as being surrounded by the conductive body elements 121 (or 141), the configuration is not limited thereto, but a part thereof may be surrounded by the conductive body elements 121 (or 141). In addition, the area of the C layer 130 in which the power source plane 131 is not formed, may be an insulating body, a conductive body, or a mixture thereof.

Figure 4:
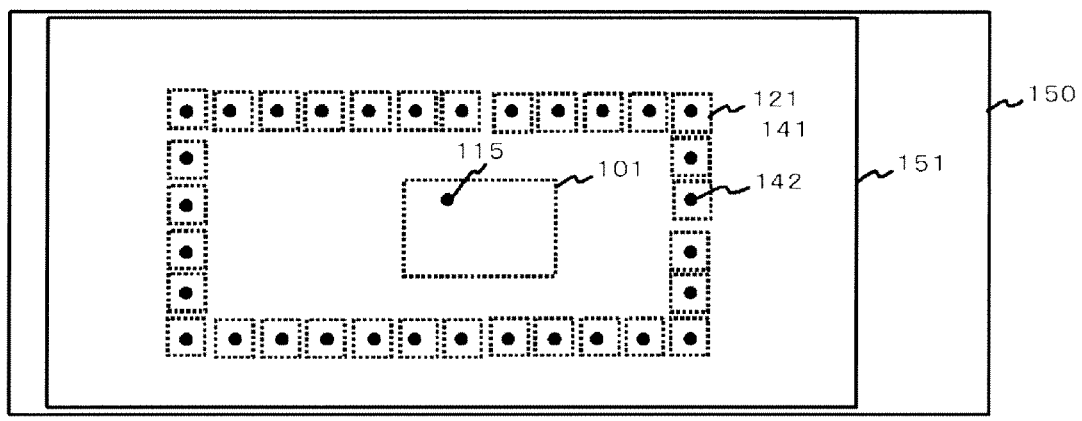
FIG. 4 is a diagram that illustrates an E layer of the wiring board.

FIG. 4 is a diagram that illustrates the E layer 150 of the wiring board 100. The E layer 150 (second layer) faces the A layer 110 through the B layer 120, the C layer 130, and the D layer 140. In addition, the ground plane 151 (third conductive body) is a sheet-shaped conductive body located in the E layer 150 and extends in an area that includes at least a part of the area surrounded by the plurality of conductive body elements 121 and 141 and at least a part of the area facing the plurality of conductive body elements 121 and 141. In addition, at least parts of the metal cap pad 113, the conductive body elements 121 and 141, and the ground plane 151 overlap each other. Furthermore, the area of the E layer 150 in which the ground plane 151 is not formed may be an insulating body, a conductive body, or a mixture thereof.

The ground plane 151 is provided with a reference electric potential through grounding or the like and serves as the ground that gives the reference electric potential to the electronic component 101. In addition, the ground plane 151 may be regarded to be provided with the reference electric potential due to its impedance that is lower than that of the other conductive bodies inside the wiring board 100.

By configuring as described above, the conductive body element 121 configures a unit cell of the EBG structure of a so-called mushroom type together with the metal cap pad 113, the power source plane 131, and the connection member 122. In addition, the conductive body element 141 configures a unit cell of the EBG structure of the mushroom type together with the ground plane 151, the power source plane 131, and the connection member 142. Described in more detail, the connection members 122 and 142 correspond to the shaft portion of the mushroom and forms inductance. On the other hand, the conductive body elements 121 and 141 correspond to a head portion of the head portion and form capacitance between the conductive body elements 121 and 141 and the opposing power source plane 131.

The EBG structure of the mushroom type can be represented by an equivalent circuit in which parallel flat plates are shunt with a serial resonance circuit that is configured by the above-described capacitance and the above-described inductance, and the resonant frequency of the above-described serial resonant circuit provides the center frequency of the band gap. Accordingly, by increasing the capacitance by approaching the conductive body elements 121 and 141 to opposing planes each forming the capacitance, the frequency of the band gap zone can be configured to be low. However, even in a case where the conductive body elements 121 and 141 are not configured to approach the opposing planes, there is no influence on the essential effect of the present invention.

By periodically arranging the such unit cells, a noise that propagates to the A layer 110 to the E layer 150 can be suppressed. In addition, it is preferable that the above-described EBG structure has a band gap zone that includes the frequency of a noise that is generated by the electronic component 101.

Here, the unit cell is a minimum unit that configures the EBG structure, and the wiring board 100 can have the characteristics of the EBG structure by including unit cells that are repeatedly arranged.

In addition, a gap between the conductive body element 121 and the metal cap pad 113, a gap between the conductive body element 141 and the ground plane 151, the thicknesses of the connection members 122 and 142, a mutual cap between the conductive body elements 121, a mutual gap between the conductive body elements 141, and the like, the frequency band that is a suppression target can be set to a desired value.

Furthermore, it is preferable that the mutual gap between unit cells that are repeatedly arranged, particularly, the conductive body elements 121 and 141 or the connection members 122 and 142 is periodical. The reason for this is that, in a case where unit cells are periodically arranged, the electromagnetic waves propagating through the EBG structure incurs Bragg reflection due to the periodicity, and accordingly, a noise propagation suppressing effect for a broad band can be acquired. However, the mutual gap between the conductive body elements 121 and the mutual gap between the conductive body elements 141 may not necessarily coincide with each other. Similarly, the mutual gap between the connection members 122 and the mutual gap between the connection members 142 may not necessarily coincide with each other. In addition, it is apparent that the unit cells do not need to be periodically arranged, and the effects of the present invention can be acquired as long as the unit cells are repeatedly arranged so as to surround a first area.

Figure 5:
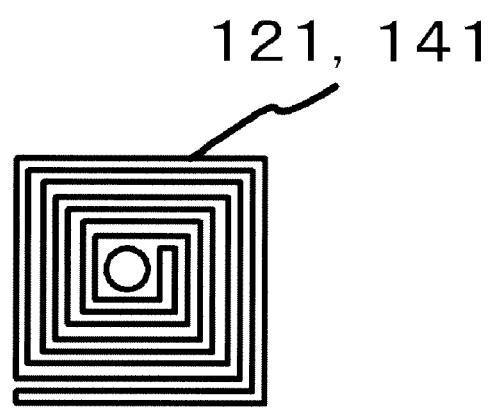
FIG. 5 is a diagram that illustrates an example of the shape of a conductive body element.
Figure 5:
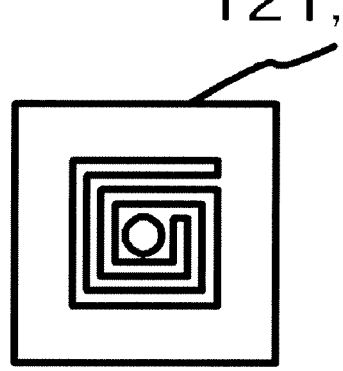

The unit cell described in this embodiment is an example, and various forms may be employed in a range in which the EBG structure can be configured. For example, FIG. 5 is a diagram that illustrates examples of the shape of the conductive body elements 121 and 141. FIG. 5(A) is a top view of an example of the conductive body elements 121 and 141. The conductive body elements 121 and 141 illustrated here represent a spiral-shaped transmission line that is formed in the plane direction, one end is connected to the connection members 122 and 142, and the other end is configured as an open end. The shape of the transmission line may not be limited to the spiral shape. For example, the transmission line may have a linear shape or a meandered shape. The unit cell configured by FIG. 5(A) has the EBG structure of a so-called open stub, and a microstrip line that is formed so as to include the conductive body elements 121 and 141 serves as an open stub.

The EBG structure of the open stub type can be represented by an equivalent circuit in which parallel flat plates are shunt with a serial resonance circuit that is configured by the above-described open stub and the above-descried inductance, and the resonant frequency of the above-described serial resonant circuit provides the center frequency of the band gap. Accordingly, by increasing the stub length of the open stub formed so as to include the above-described conductive body elements 121 and 141, the frequency of the band gap zone can be configured to be low.

In addition, it is preferable that the conductive body elements 121 and 141 that form the microstrip lines and the opposing planes are close to each other. The reason for this is that, as a distance between the conductive body element and the opposing plane becomes shorter, the characteristic impedance of the above-described micro strip line is lowered, and the band gap zone can be configured to be a broad band. However, even in a case where the conductive body elements 121 and 141 are not configured to be close to the opposing planes, the essential effects of the present invention are not influenced at all.

The conductive body elements 121 and 141 illustrated in FIG. 5(B) are rectangle conductive bodies and have an opening. Inside the opening, a spiral-shaped inductor of which one end is connected to the deep pool of the opening, and the other end is connected to the connection members 122 and 142 is formed. The transmission line may not be limited to the spiral shape. For example, the transmission line may have a linear shape or a meandered shape. The unit cell that is configured by FIG. 5(B) is the EBG structure of a so-called inductance-increased type, and the inductance increases by arranging an inductor in a head portion of the mushroom based on the mushroom-type EBG structure.

The EBG structure of the mushroom type can be represented by an equivalent circuit in which parallel flat plates are shunt with a serial resonance circuit that is configured by the above-described capacitance and the above-described inductance, and the resonant frequency of the above-described serial resonant circuit provides the center frequency of the band gap. Accordingly, by increasing the capacitance by configuring the conductive body elements 121 and 141 to approach opposing planes that form capacitance or by increasing the inductance by increasing the length of the inductor, the frequency of the band gap zone can be configured to be low. However, even in a case where the conductive body elements 121 and 141 are not configured to approach the opposing planes, there is no influence on the essential effect of the present invention.

Here, the advantages of the first embodiment will be described. In a case where the electronic component 101 and the metal cap 102 are mounted on the wiring board 100 according to this embodiment, a noise that propagates from the electronic component 101 through the air can be shielded by the metal cap 102. In addition, a noise that propagates on the A layer 110, that is, a so-called a surface wave can be shielded by the metal cap pad 113 that surrounds the electronic component 101. Furthermore, a noise that propagates between the power source plane 131 and the ground plane 151 can be shielded by the EBG structure that is formed by an area in which a plurality of the conductive body elements 141 and at least one of the power source plane 131 and the ground plane 151 face each other. In addition, a noise that propagates between the power source plane 131 and the ground plane 151 and further leaks from the gap 137 can be shielded through the EBG structure that is configured by an area in which a plurality of the conductive body elements 121 and at least one of the metal cap pad 113 and the power source plane 131 face each other or the metal cap 102. In other words, since a countermeasure is taken in the wiring board 100 for all the directions of the noise propagating from the electronic component 101, the leakage of the noise can be prevented.

In addition, by including the frequency of a noise that is generated from the electronic component 101 in the band gap zone of the EBG structure that is configured by this embodiment, a higher noise suppressing effect can be acquired.

Furthermore, in this embodiment, since the metal cap pad 113 is also used as one of the constituent elements of the EBG structure, mounting can be performed by saving the space. Accordingly, the wiring board 100 can be miniaturized.

Second Embodiment

Figure 6:
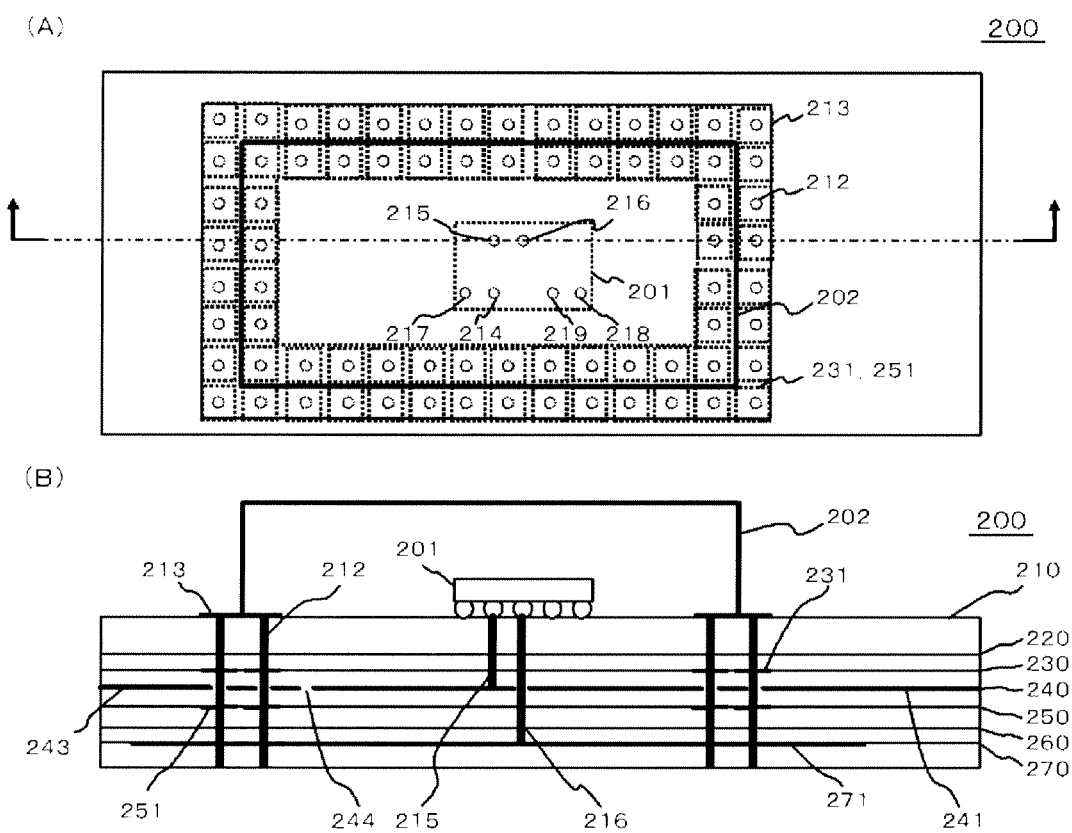
FIG. 6 represents a top view and a cross-sectional view of an electronic device according to a second embodiment of the present invention.

FIG. 6 represents a top view and a cross-sectional view of an electronic device 200 according to a second embodiment of the present invention. Described in more detail, FIG. 6(A) is a top view of the electronic device 200, and FIG. 6(B) is a cross-sectional view of an electronic device 200 that is taken along a cross-section line represented in FIG. 6(A). The electronic device 200 is a multi-layer board that includes at least an A layer 210, a B layer 220, a C layer 230, a D layer 240, an E layer 250, and an F layer 260, and a G layer 270 facing one another. In addition, the electronic device 200 may further include a layer other than the above-described seven layers. For example, a dielectric layer may be located between the layers. Furthermore, the electronic device 200 may further include a hole, a via, or the like that is not shown in the diagrams in a range not contradicting the configuration of the present invention. In addition, in the above-described seven layers, signal lines may be arranged in a range not contradicting the configuration of the present invention.

In addition, in FIG. 6(A), an electronic component 201 is denoted by broken lines. This represents that the electronic component 201 is covered with a metal cap 202. In other words, in the A layer 210 (one face) that is the surface layer of the electronic device 200, the electronic component 201 is mounted. In addition, the electronic device 200 includes a connection member 215 (first connection member) that connects the electronic component 201 and a power source plane 241 (second conductive body), a connection member 219 (first connection member) that connects the electronic component 201 and a power source plane 242 (second conductive body), and a connection member 214 (first connection member) that connects the electronic component 201 and a power source plane 243 (second conductive body). In addition, the electronic device 200 includes a connection member 216

(second connection member) that connects the electronic component 201 and a ground plane 271 (third conductive body). Here, as the electronic component 201, a component such as an LSI is assumed. In addition, the number of electronic components 201 that are mounted on the electronic device 200 may be one or more. Furthermore, the connections of the connection member 214, the connection member 215, the connection member 216, and the connection member 219 will be described later with reference to FIGS. 7 to 10.

The metal cap pad 213 (first conductive body) is located on the A layer 210 and surrounds the connection members 215, 216, 217, and 218. In addition, an end portion of the metal cap 202 is connected to the metal cap pad 213 using solder or the like. Furthermore, the shape of the metal cap 202 may be various forms. For example, the shape of the metal cap 202 may be a polyhedron or a sphere. In addition, the shape of the metal cap 202 may be a mesh having an opening to some degree from which a noise does not leak.

A connection member 212 is a through via that passes through in a direction perpendicular to the plane direction and connects the metal cap pad 213, the ground plane 271, and conductive body elements 231 and 251 (fourth conductive body).

In addition, in FIG. 6(A), the conductive body elements 231 and 251 are located on a layer that is lower than the A layer 210, and accordingly, the conductive body elements 231 and 251 are denoted by broken lines, the positions of both elements overlap each other in the plan view, and accordingly, the conductive body elements 231 and 251 are denoted by one rectangle. Furthermore, the conductive body element 231 and the conductive body element 251 may not necessarily be arranged at positions overlapping each other in the plan view but may be arranged at positions not coinciding with each other in the plan view. In addition, the shape of the conductive body element 231 or the conductive body element 251 is not limited to a rectangle but may be a triangle, a hexagon, or the like.

In the electronic device 200 according to this embodiment, the electronic component 201 is located in an area overlapping a part of a gap 244. The reason for this is that, in a case where power is assumed to be supplied to the single electronic component 201 from the power source plane 241 (or 242 or 243), the connection to the power source plane 241 (or 242 or 243) can be made in a relatively easy manner. However, the electronic component 201 does not necessarily need to be disposed in an area overlapping the gap 244 in the plan view.

Figure 7:
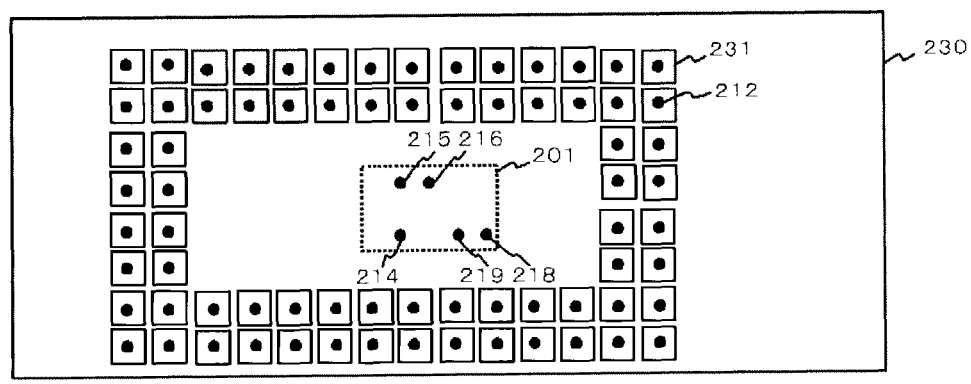
FIG. 7 is a diagram that illustrates a C layer and an E layer of the electronic device.
Figure 7:
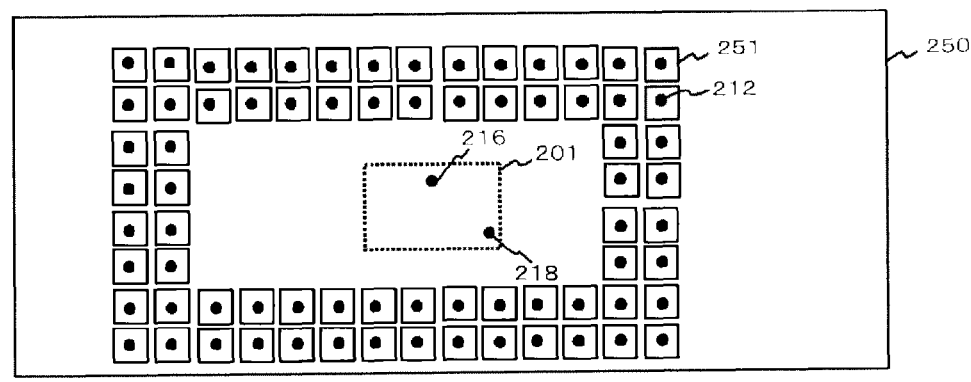

FIG. 7 is a diagram that illustrates the C layer 230 and the E layer 250 of the electronic device 200. In the C layer 230, a plurality of the conductive body elements 231 is repeatedly arranged so as to surround the connection members 214, 215, 216, 218, and 219. In addition, in the E layer 250, a plurality of the conductive body elements 251 is repeatedly arranged so as to surround the connection members 216 and 218. In addition, in an area surrounded by the plurality of conductive body elements 231 and 251, at least a part of the gap 244 is included. Furthermore, an area in which the conductive body element 231 is not arranged in the C layer 230 is formed as an insulating body and is insulated from the connection members 219, 214, 215, 216, 218, and the like. Alternatively, an area in which the conductive body element 251 is not arranged in the E layer 250 is formed as an insulating body and is insulated from the connection members 216, 218, and the like. The positional relation between a plurality of the conductive body elements 231 (or the conductive body elements 251) and the gap 244 will be described later with reference to FIG. 9.

In addition, in this embodiment, a plurality of the conductive body elements 231 and 251 is arranged in any direction viewed from the electronic component 201. By arranging as such, a noise can be shielded more effectively than in a case where the conductive body elements are arranged in a single column as in the first embodiment.

Figure 8:
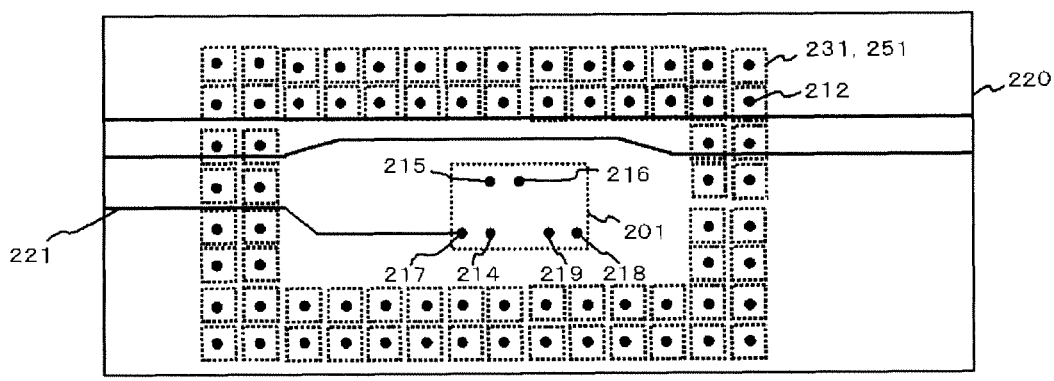
FIG. 8 is a diagram that illustrates a B layer and an F layer of the electronic device.
Figure 8:
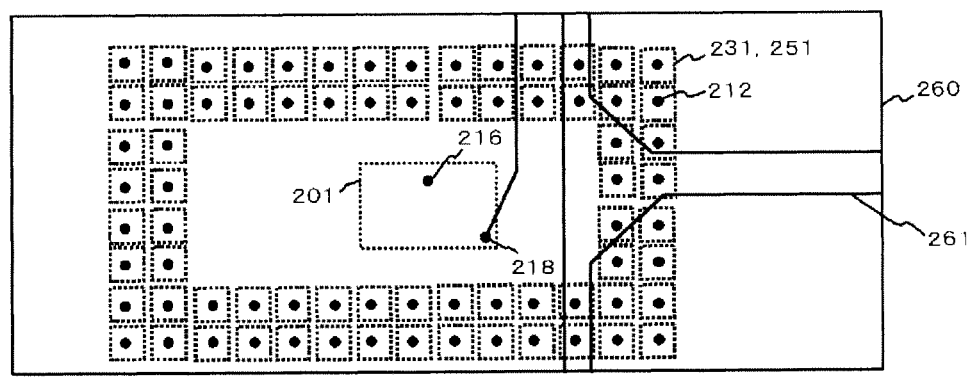

FIG. 8 is a diagram that illustrates the B layer 220 and the F layer 260 of the electronic device 200. The B layer 220 and the F layer 260 are so-called wiring layers, and a signal line 221 or a signal line 261 is arranged. In addition, the arrangement pattern of the signal lines 221 and 261 is not limited to that illustrated in the diagram but may be arranged in a range not being electrically connected to the connection member 212.

Figure 9:
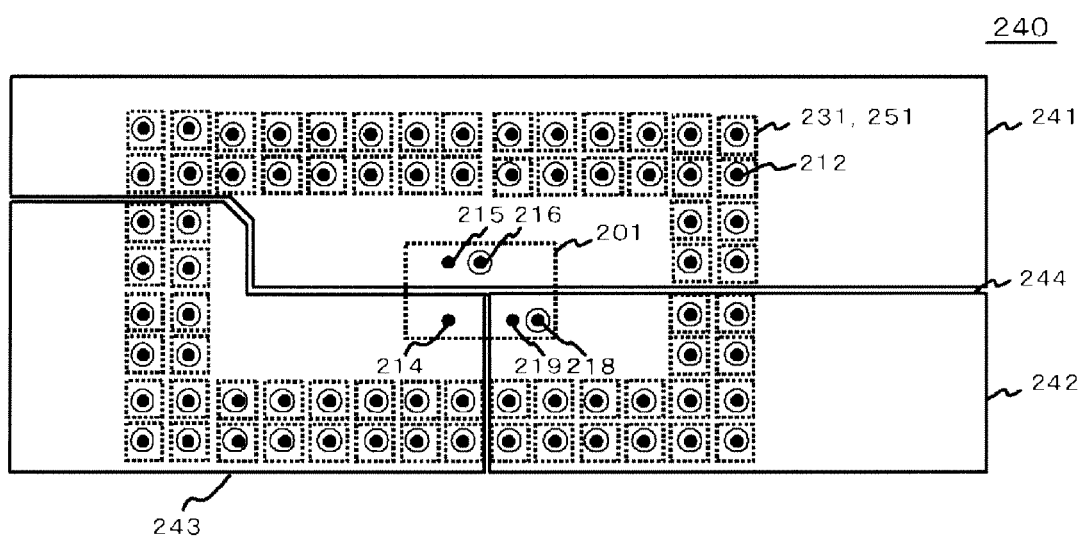
FIG. 9 is a diagram that illustrates a D layer of the electronic device.

FIG. 9 is a diagram that illustrates the D layer 240 of the electronic device 200. In the D layer 240 (third layer) that is a middle layer between the A layer 210 and the G layer 270, the power source plane 241 (or 242 or 243) extends so as to be divided so as to be apart away from the gap 244. In addition, at least a part of the gap 244 is included in the area that is surrounded by the conductive body elements 231 and 251. In addition, since an insulating body is filled in the gap 244, the power source plane 241 (or 242 or 243) is mutually insulated from each other, and different electrical potentials can be applied thereto. However, it is not necessary to apply electric potentials that are different from one another, but the same electric potential may be applied thereto.

The power source plane 241 is connected to the connection member 215, the power source plane 242 is connected to the connection member 219, and the power source plane 243 is connected to the connection member 214. In addition, since the connection member 212 or the connection member 216 are connected to the ground plane 271, an opening is disposed in the power source plane 241 (or 242 or 243) that allows the connection member 212 or the connection member 216 to passes through it, and the power source plane 241 (or 242 or 243), the connection member 212 or the connection member 216 are insulated from each other. In addition, a part or the whole of the conductive body elements 231 and 251 are arranged so as to face the opening through which the connection member 212 passes. Furthermore, the conductive body elements 231 and 251 that face the opening are larger than the opposing opening. In other words, apart of the conductive body element 231 faces a conductive body (apart of the power source planes 241, 242, and 243) disposed on the periphery of the opening, and apart of the conductive body element 251 faces the conductive body (parts of the power source planes 241, 242, and 243) disposed on the periphery of the opening.

In this embodiment, although connect ion points with the connection members 214, 215, and 219 are arranged in all the power source planes 241, 242, and 243 illustrated in the diagram, the connection points do not need to be arranged in all the power source planes. In other words, connection points with the connection members 214, 215, and 219 may be disposed in at least one of the power source planes 241, 242, and 243.

Figure 10:
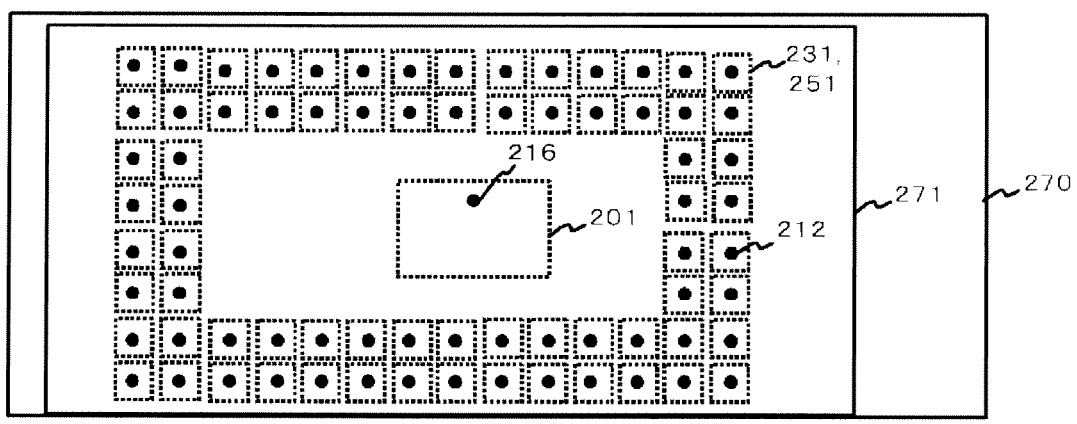
FIG. 10 is a diagram that illustrates a G layer of the electronic device.

FIG. 10 is a diagram that illustrates the G layer 270 of the electronic device 200. The G layer 270 faces the A layer 210 through the B layer 220 or the F layer 260. In addition, the ground plane 271 is a sheet-shaped conductive body, is located in the G layer 270, and extends in an area that including at least apart of the area that is surrounded by a plurality of the conductive body elements 231 and 251 and at least a part of the area facing the plurality of the conductive body elements 231 and 251. Furthermore, the metal cap pad 213, the conductive body elements 231 and 251, and the ground plane 271 face each other at least in parts thereof. In addition, in the G layer 270, the area in which the ground plane 271 is not formed may be formed as an insulating body, a conductive body, or a mixture thereof.

The ground plane 271 is provided with a reference electric potential through grounding or the like and serves as the ground that gives the reference electric potential to the electronic device 200. In addition, the ground plane 271 may be regarded to be provided with the reference electric potential due to its impedance that is lower than that of the other conductive bodies inside the electronic device 200.

By configuring as described above, the conductive body elements 231 and 251 configures at least a part of a unit cell of the EBG structure together with the opposing metal cap pad 213 and the ground plane 271 or the connection member 212. In addition, it is preferable that the above-described EBG structure includes the frequency of a noise that is generated by the electronic component 201 in the band gap zone.

The unit cell described in this embodiment is an example, and various forms may be employed in a range in which the EBG structure can be configured.

FIGS. 11 to 15 are diagrams that illustrate examples of a unit cell that includes the conductive body elements 231 and 251. In addition, FIGS. 11 to 15 are focused on a single conductive body element 231 or a single conductive body element 251 and the periphery thereof is illustrated in the diagrams in an enlarged scale. Each one of the structures illustrated in FIGS. 11 to 15 as examples configures a single or a plurality of unit cells, and the electronic device 200 includes one of such a unit cell or a plurality of sets of the unit cell.

Figure 11:
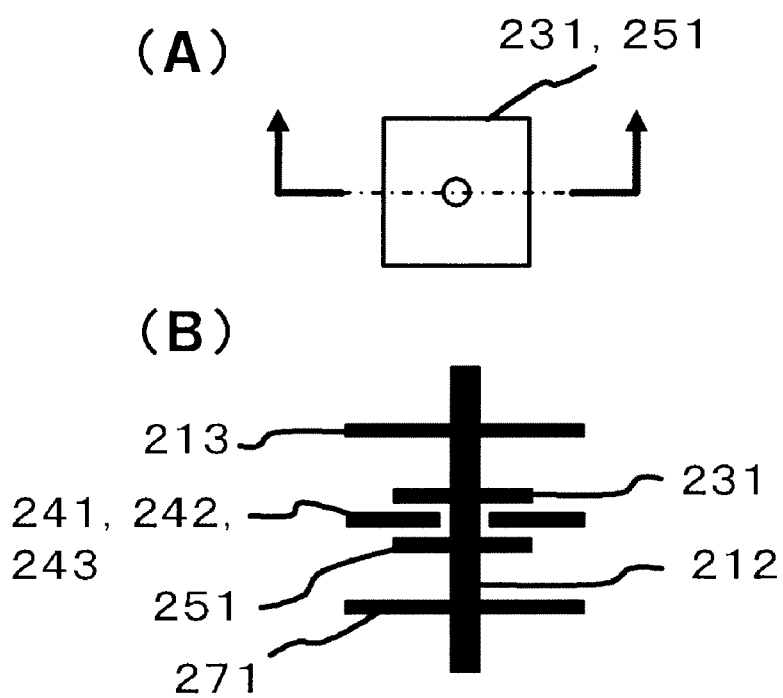
FIG. 11 is a diagram that illustrates an example of a unit cell that includes a conductive body element.

FIG. 11(A) is a top view of an example of the conductive body elements 231 and 251. The conductive body elements 231 and 251 illustrated here in the diagram has a rectangle shape and is connected to the connection member 212. FIG. 11(B) is a cross-sectional view of the electronic device 200 on the periphery of the conductive body elements 231 and 251 illustrated in FIG. 11(A). The connection member 212 is connected to the metal cap pad 213 and the ground plane 271 and passes through the power source plane 241 (or 242 or 243). In addition, the unit cell illustrated in FIG. 11 is the same as that used in the EBG structure described with reference to FIGS. 6 to 10.

The above-described structure illustrated in FIG. 11 is a modified example of the EBG structure of the mushroom type. Described in more detail, the connection member 212 corresponds to the shaft portion of the mushroom and forms inductance. On the other hand, the conductive body elements 231 and 251 correspond to a head portion of the mushroom and form capacitance between the conductive body elements 231 and 251 and the opposing power source plane 241 (or 242 or 243).

The structure illustrated here, similarly to the EBG structure of the mushroom type, can be represented by an equivalent circuit in which parallel flat plates that are formed by the metal cap pad 213 and the power source plane 241 (or 242 or 243) or parallel flat plates formed by the power source plane 241 (or 242 or 243) and the ground plane 271 are shunt with a serial resonance circuit that is configured by the above-described capacitance and the above-described inductance, and the resonant frequency of the above-described serial resonant circuit provides the center frequency of the band gap. Accordingly, by increasing the capacitance by approaching the conductive body elements 231 and 251 to opposing planes each forming the capacitance, the frequency of the band gap zone can be configured to be low. However, even in a case where the conductive body elements 231 and 251 are not configured to approach the opposing planes, there is no influence on the essential effect of the present invention.

By employing this structure, the EBG structure can be formed in the parallel flat plates using the through via. Generally, while a non-through via is laminated after the via is processed for each layer, a through via is formed by forming a through hole using a drill after all the layers are laminated and plating the inner face of the through hole, and accordingly, the manufacturing cost can be lowered than that of a case where a non-through via is used.

FIG. 12(A) is a top view of an example of the conductive body elements 231 and 251. The conductive body elements 231 and 251 illustrated here represent a spiral-shaped transmission line that is formed in the plane direction, one end is connected to the connection member 212, and the other end is configured as an open end. Although a case has been illustrated in which the shape of the transmission line is a spiral shape, the shape may not be limited thereto. For example, the transmission line may have a linear shape or a meandered shape. FIG. 12(B) is a cross-sectional view of the electronic device 200 on the periphery of the conductive body elements 231 and 251 illustrated in FIG. 12(A). The connection member 212 is connected to the metal cap pad 213 and the ground plane 271 and passes through the opening of the power source plane 241 (or 242 or 243).

Figure 12:
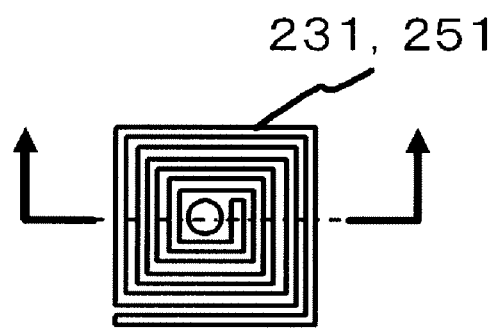
FIG. 12 is a diagram that illustrates an example of a unit cell that includes a conductive body element.
Figure 12:
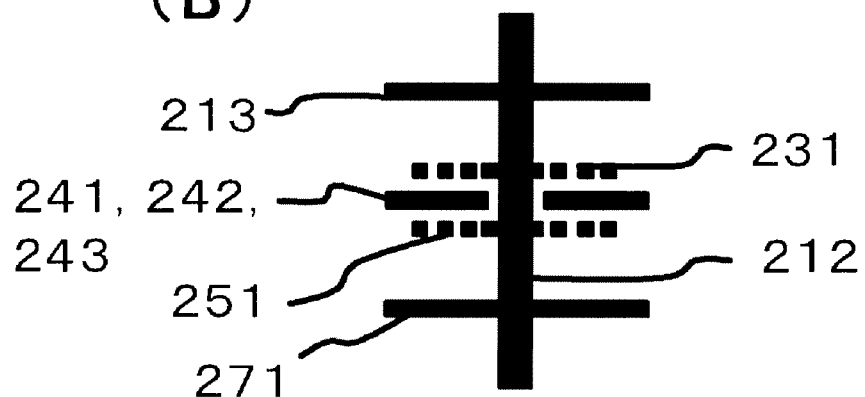

The structure illustrated in FIG. 12 is a modified example of the EBG structure of the open stub type in which a microstrip line formed so as to include the conductive body elements 231 and 251 serves as an open stub. Described in more detail, the connection member 212 forms inductance. On the other hand, by electrically combining the conductive body elements 231 and 251 with opposing power source plane 241 (or 242 or 243), a microstrip line that has the power source plane 241 (or 242 or 243) as a return path is formed. One end of the above-described microstrip line is configured as an open end and is configured so as to serve as an open stub.

The structure illustrated in FIG. 12, similarly to the EBG structure of the open stub type, can be represented by an equivalent circuit in which parallel flat plates, which are formed by the metal cap pad 213 and the power source plane 241 (or 242 or 243), or parallel flat plates, which are formed by the power source plane 241 (or 242 or 243) and the ground plane 271, are shunt with a serial resonance circuit that is configured by the above-described open stub and the above-descried inductance, and the resonant frequency of the above-described serial resonant circuit provides the center frequency of the band gap. Accordingly, by increasing the stub length of the open stub formed so as to include the above-described conductive body elements 231 and 251, the frequency of the band gap zone can be configured to be low.

In addition, it is preferable that the conductive body elements 231 and 251 that form the microstrip lines and the opposing planes are close to each other. The reason for this is that, as a distance between the conductive body element and the opposing plane becomes shorter, the characteristic impedance of the above-described micro strip line is lowered, and the band gap zone can be configured to be a broad band. However, even in a case where the conductive body elements 231 and 251 are not configured to be close to the opposing planes, the essential effects of the present invention are not influenced at all.

By employing the structure illustrated here, the EBG structure can be formed in the parallel flat plates using the through via. Generally, while a non-through via is laminated after the via is processed for each layer, a through via is formed by forming a through hole using a drill after all the layers are laminated and plating the inner face of the through hole, and accordingly, the manufacturing cost can be lowered than that of a case where a non-through via is used.

FIG. 13(A) is a top view of an example of the conductive body elements 231 and 251. The conductive body elements 231 and 251 illustrated here are rectangle conductive bodies and have an opening. Inside the opening, a spiral-shaped inductor of which one end is connected to the deep pool of the opening, and the other end is connected to the connection members 212 is formed. Although a case has been illustrated in which the shape of the above-described inductor is a spiral shape, the shape is not limited thereto. For example, the inductor may have a linear shape or a meandered shape. FIG. 13(B) is a cross-sectional view of the electronic device 200 on the periphery of the conductive body elements 231 and 251 illustrated in FIG. 13(A). The connection member 212 is connected to the metal cap pad 213 and the ground plane 271 and passes through the opening of the power source plane 241 (or 242 or 243).

Figure 13:
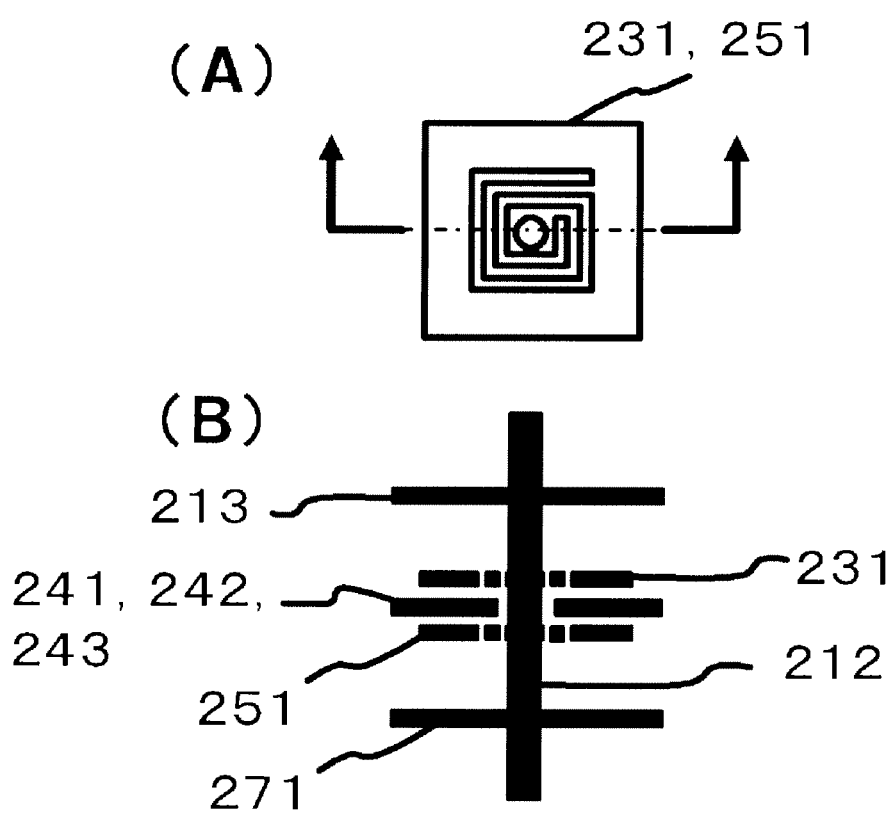
FIG. 13 is a diagram that illustrates an example of a unit cell that includes a conductive body element.

The above-described structure illustrated in FIG. 13 is a modified example of the EBG structure of the inductance increasing type in which the inductance is increased by arranging an inductor in the head portion of the mushroom. Described in more detail, the connection member 212 corresponds to the shaft portion of the mushroom and forms inductance. On the other hand, the conductive body elements 231 and 251 correspond to a head portion of the mushroom and form capacitance between the conductive body elements 231 and 251 and the opposing power source plane 241 (or 242 or 243).

The structure illustrated in FIG. 13, similarly to the EBG structure of the mushroom type, can be represented by an equivalent circuit in which parallel flat plates that are formed by the metal cap pad 213 and the power source plane 241 (or 242 or 243) or parallel flat plates formed by the power source plane 241 (or 242 or 243) and the ground plane 271 are shunt with a serial resonance circuit that is configured by the above-described capacitance and the above-described inductance, and the resonant frequency of the above-described serial resonant circuit provides the center frequency of the band gap. Accordingly, by increasing the capacitance by approaching the conductive body elements 231 and 251 to opposing planes each forming the capacitance or increasing the inductance by increasing the length of the inductor, the frequency of the band gap zone can be configured to be low. However, even in a case where the conductive body elements 231 and 251 are not configured to approach the opposing planes, there is no influence on the essential effect of the present invention.

By employing the structure illustrated here, the EBG structure can be formed in the parallel flat plates using the through via. Generally, while a non-through via is laminated after the via is processed for each layer, a through via is formed by forming a through hole using a drill after all the layers are laminated and plating the inner face of the through hole, and accordingly, the manufacturing cost can be lowered than that of a case where a non-through via is used.

FIG. 14(A) is a top view of an example of the conductive body elements 231 and 251. The conductive body elements 231 and 251 illustrated here have a rectangle shape and are connected to the connection member 212. In addition, FIG. 14(B) is a top view of an area of the metal cap pad 213 or the ground plane 271 that face the conductive body elements 231 and 251. Here, the illustrated area has an opening, and inside the opening, a spiral-shaped inductor is formed of which one end is connected to the deep pool of the opening, and the other end is connected to the connection member 212. Although a case has been illustrated in which the shape of the inductor is a spiral shape, the shape may not be limited thereto. For example, the inductor may have a linear shape or a meandered shape. FIG. 14(C) is a cross-sectional view of the electronic device 200 on the periphery of the conductive body elements 231 and 251 illustrated in FIG. 14(A). The connection member 212 is connected to the inductor that is formed in the opening of the metal cap pad 213 and the inductor that is formed in the opening of the ground plane 271.

Figure 14:
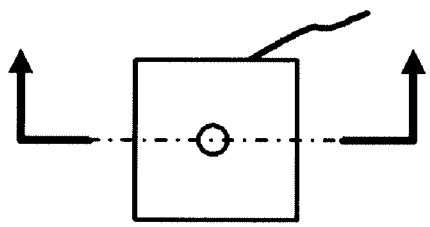
FIG. 14 is a diagram that illustrates an example of a unit cell that includes a conductive body element.
Figure 14:
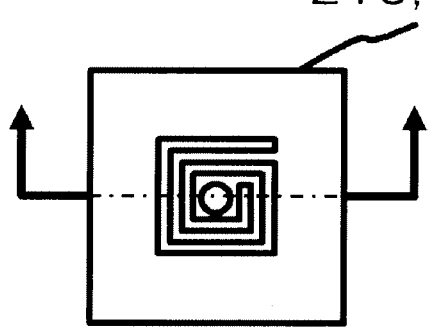
Figure 14:
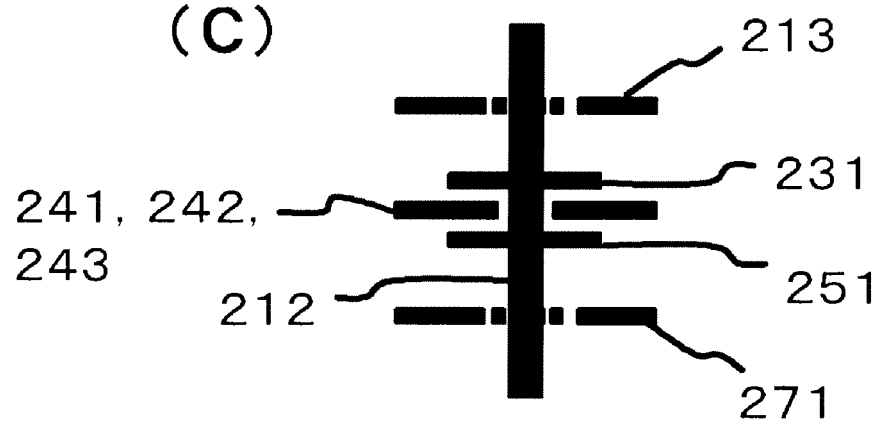

The above-described structure illustrated in FIG. 14 is a modified example of the EBG structure of the inductance increasing type in which the inductance is increased by arranging an inductor in the metal cap pad 213 or the ground plane 271 based on the EBG structure of the mushroom type. Described in more detail, the conductive body elements 231 and 251 correspond to a head portion of the mushroom and forms capacitance between the conductive body elements 231 and 251 and the opposing power source plane 241 (or 242 or 243). On the other hand, the connection member 212 corresponds to a shaft portion of the mushroom and forms inductance together with the inductor disposed in the metal cap pad 213 or the ground plane 271.

The EBG structure of the inductance increasing type can be represented by an equivalent circuit in which parallel flat plates, which are formed by the metal cap pad 213 and the power source plane 241 (or 242 or 243), or parallel flat plates, which are formed by the power source plane 241 (or 242 or 243) and the ground plane 271, are shunt with a serial resonance circuit that is configured by the above-described capacitance and the above-described inductance, and the resonant frequency of the above-described serial resonant circuit provides the center frequency of the band gap. Accordingly, by increasing the capacitance by approaching the conductive body elements 231 and 251 to opposing planes each forming the capacitance or increasing the inductance by increasing the length of the inductor, the frequency of the band gap zone can be configured to be low. However, even in a case where the conductive body elements 231 and 251 are not configured to approach the opposing planes, there is no influence on the essential effect of the present invention.

FIG. 15(A) is a top view of an example of the conductive body element 231. The conductive body elements 231 illustrated here is a spiral-shaped transmission line of which one end is connected to the connection member 212, and the other end is illustrated as an open end, formed in the plane direction. Although a case has been illustrated in which the shape of the transmission line is a spiral shape, the shape may not be limited thereto. For example, the transmission line may have a linear shape or a meandered shape. FIG. 15(B) is a cross-sectional view of the periphery of the conductive body element 231 that is taken along a cross-section line illustrated in FIG. 15(A). The connection member 212 is connected to the metal cap pad 213 and the ground plane 271 and passes the opening of the power source plane 241 (or 242 or 243). In addition, the conductive body element 231 faces the opening.

In the configuration illustrated in FIGS. 15(A) and 15(B), the conductive body element 231 configures the EBG structure of the open stub type together with the metal cap pad 213, the power source plane 241 (or 242 or 243), and the connection member 212, and a noise propagating through the parallel flat plates formed by the metal cap pad 213 and the power source plane 241 (or 242 or 243) is suppressed. At the same time, the conductive body element 231 configures the EBG structure of the open stub type together with the ground plane 271, the power source plane 241 (or 242 or 243), and the connection member 212, and accordingly, a noise propagating the parallel flat plate formed by the power source plane 241 (or 242 or 243) and the ground plane 271 can be suppressed. In other words, although the number of the C layers 230, in which the conductive body element 231 is formed, is the same as the number of the D layers 240, in which the power source planes 241 (or 242 or 243) is formed, the EBG structure can be configured for both parallel flat plates. Accordingly, compared to the configuration illustrated in FIG. 12, the conductive body element 251 is not necessary, and therefore, the degree of freedom for leading out the wirings in the F layer 260 is improved. In addition, in a case where a wiring does not need to be formed in the F layer 260, it is possible to omit the F layer 260, whereby the electronic device 200 can be formed to be thin.

Also in the structure illustrated in FIGS. 15(A) and 15(B), same as the other EBG structures of the open stub type, by increasing the stub length of the open stub formed so as to include the above-described conductive body element 231, the frequency of the band gap zone can be configured to be low. In addition, it is preferable that the conductive body element 231 that forms the microstrip lines and the opposing plane is close to each other. The reason for this is that, as a distance between the conductive body element and the opposing plane becomes shorter, the characteristic impedance of the above-described micro strip line is lowered, and the band gap zone can be configured to be a broad band. However, even in a case where the conductive body element 231 is not configured to be close to the opposing plane, the essential effects of the present invention are not influenced at all.

FIG. 15(C) is a top view of an example of the conductive body element 231. Here, the conductive body element 231 illustrated here has a rectangle shape and is electrically connected to the connection member 212. FIG. 15(D) is a cross-sectional view of the periphery of the conductive body element 231 that is taken along a cross-section line illustrated in FIG. 15(C). In FIG. 15(D), the connection member 212 is formed as a through via, and the through via is connected to the metal cap pad 213 and the ground plane 271 and passes through the opening of the power source plane 241 (or 242 or 243).

In the configuration illustrated in FIGS. 15(C) and 15(D), the conductive body element 231 configures the EBG structure of the mushroom type together with the metal cap pad 213, the power source plane 241 (or 242 or 243), and the connection member 212, and a noise propagating through the parallel flat plates formed by the metal cap pad 213 and the power source plane 241 (or 242 or 243) is suppressed. At the same time, the conductive body element 231 configures the EBG structure of the mushroom type together with the ground plane 271, the power source plane 241 (or 242 or 243), and the connection member 212, and accordingly, a noise propagating the parallel flat plate formed by the power source plane 241 (or 242 or 243) and the ground plane 271 can be suppressed. In other words, although the number of the C layers 230, in which the conductive body element 231 is formed, is the same as the number of the D layers 240, in which the power source planes 241 (or 242 or 243) is formed, the EBG structure can be configured for both parallel flat plates. Accordingly, compared to the configuration illustrated in FIG. 11, the conductive body element 251 is not necessary, and therefore, the degree of freedom for leading out the wirings in the F layer 260 is improved. In addition, in a case where a wiring does not need to be formed in the F layer 260, it is possible to omit the F layer 260, whereby the wiring board 200 can be formed to be thin.

Figure 15:
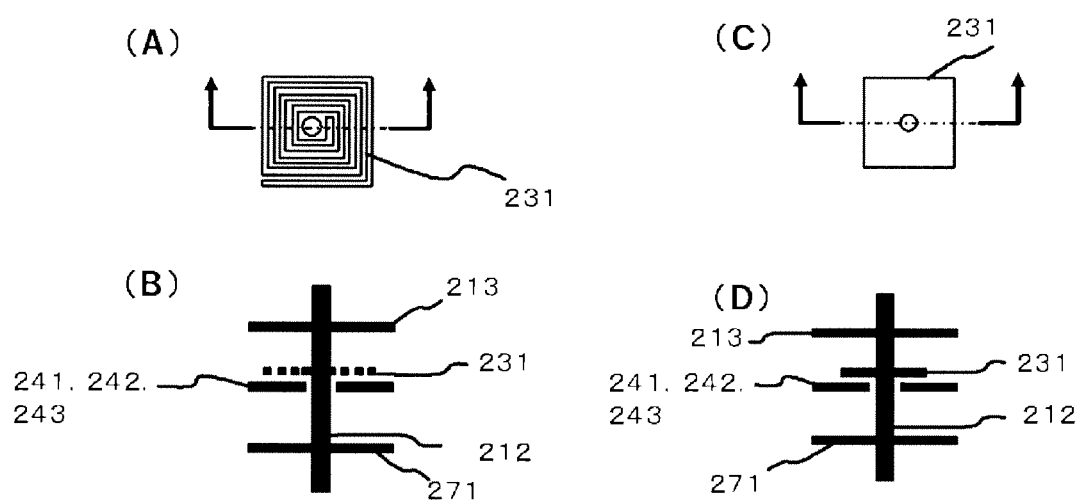
FIG. 15 is a diagram that illustrates an example of a unit cell that includes a conductive body element.

In FIG. 15, although the conductive body element 231 is illustrated to be located between the metal cap pad 213 and the power source plane 241 (or 242 or 243), the conductive body element 231 may be located between the power source plane 241 (or 242 or 243) and the ground plane 271.

Here, the advantages of the second embodiment will be described. In the electronic device 200 according to this embodiment, similarly to the first embodiment, since a countermeasure is taken for all the directions of the noise propagating from the electronic component 201, the leakage of the noise can be prevented. In addition, by including the frequency of the noise generated from the electronic component 201 in the band gap zone of the EBG structure that is configured in accordance with this embodiment, a higher noise suppressing effect can be acquired.

In addition, the connection member 212 as a through via is configured to pass through the conductive body elements 231 and 251 and the metal cap pad 213, the manufacturing process can be shortened. In addition, in an area located on the A layer 210 that is occupied by the connection member 212 passing through it, the metal cap pad 213 is disposed, and accordingly, mounting can be performed while the space is saved. Therefore, the electronic device 200 can be miniaturized.

Furthermore, in the electronic device 200, a noise propagating in the plane direction is configured to pass a plurality of unit cells, and the propagation of electromagnetic waves can be suppressed more effectively.

Third Embodiment

Figure 16:
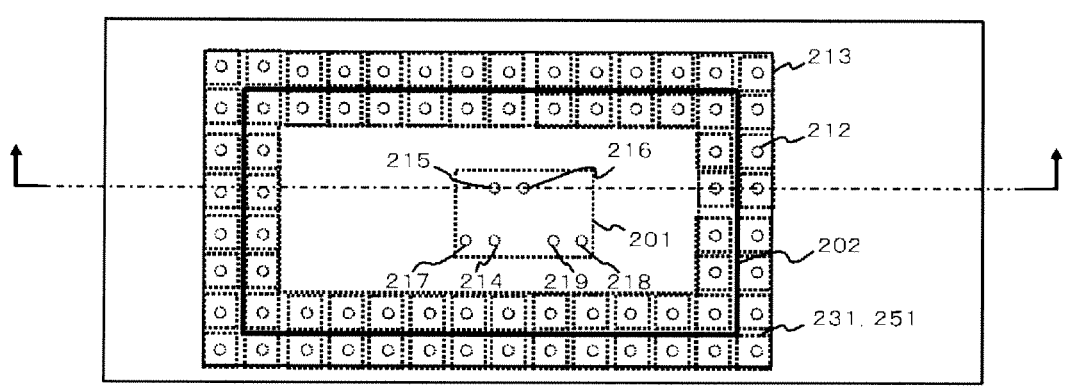
FIG. 16 represents a top view and a cross-sectional view of an electronic device according to a third embodiment of the present invention.
Figure 16:
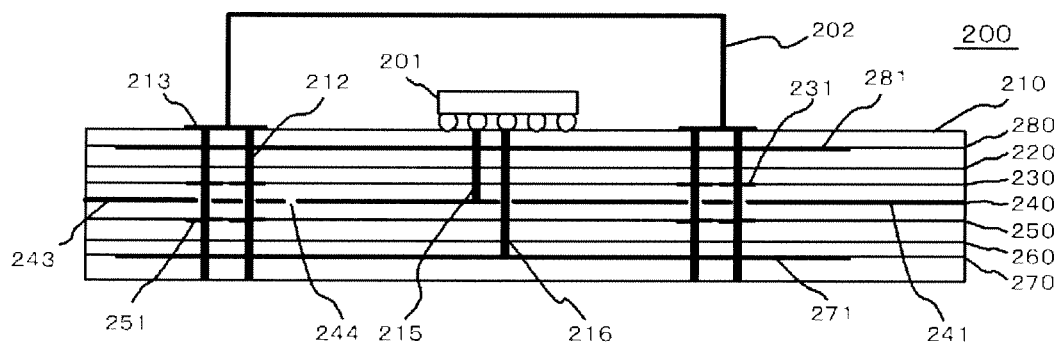

FIG. 16 represents a top view and a cross-sectional view of an electronic device 200 according to a third embodiment of the present invention. Described in more detail, FIG. 16(A) is a top view of the electronic device 200, and FIG. 16(B) is a cross-sectional view of the electronic device 200 that is taken along a cross-section line represented in FIG. 16(A). The electronic device 200 of this embodiment has a configuration that is acquired by adding an H layer 280 to the electronic device 200 described in the second embodiment. The constituent elements included in the A layer 210, the B layer 220, the C layer 230, the D layer 240, the E layer 250, the F layer 260, and the G layer 270 are similar to those of the second embodiment, and the detailed description thereof will not be presented.

Figure 17:
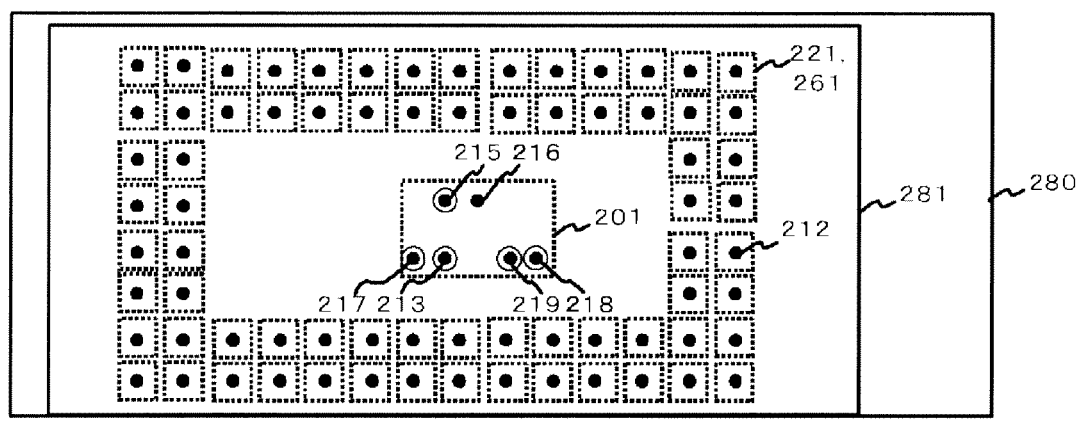
FIG. 17 is a diagram that illustrates an H layer of the electronic device.

FIG. 17 is a diagram that illustrates the H layer 280 of the electronic device 200. The H layer 280 (third layer) is located between the A layer 210 and the B layer 220 and faces the G layer 270 through the D layer 240. In addition, a ground plane 281 (fifth conductive body) disposed in the H layer 280 is a sheet-shaped conductive body and extends in an area that includes at least apart of an area surrounded by a plurality of conductive body elements 231 and 251 and at least a part of an area that faces the plurality of conductive body elements 231 and 251. In addition, the conductive body elements 231 and 251 and the ground plane 281 face each other at least in parts. Furthermore, in an area disposed in the H layer 280 in which the ground plane 281 is not formed may be configured as an insulating body, a conductive body, or a mixture thereof.

In addition, the ground plane 281 and the ground plane 271 are connected to the connection member 216 and the connection member 212 so as to have the same electric potentials and serve as the ground of the electronic device 200. Furthermore, in the ground plane 281, an opening through which the connection members 219, 214, 215, 217, and 218 pass is formed and is insulated from the connection members 219, 214, 215, 217, and 218.

Here, the advantages of the third embodiment will be described. In the wiring board 200 according to this embodiment, a noise propagating from the electronic component 201 to the air can be shielded by the metal cap 202. In addition, a noise propagating above the A layer 210, that is, a so-called surface wave can be shielded by the metal cap pad 213 that surrounds the electronic component 201. Furthermore, a noise propagating between the power source plane 241 (or 242 or 243) and the ground plane 281 (first parallel flat plate) can be shielded by the EBG structure that is configured by an area in which a plurality of the conductive body elements 231 and at least one of the power source plane 241 (or 242 or 243) and the ground plane 281 face each other. In addition, a noise propagating between the power source plane 241 (or 242 or 243) and the ground plane 271 (second parallel flat plate) can be shielded by the EBG structure that is configured by an area in which a plurality of conductive body elements 251 and at least one of the power source plane 241 (or 242 or 243) and the ground plane 271 face each other. Furthermore, a noise the leaks from the first parallel flat plate to the second parallel flat plate through the gap 244 or from the second parallel flat plate to the first parallel flat plate can be shielded by the ground plane 271 or the ground plane 281. In other words, in the electronic device 200, since a countermeasure is taken for all the propagation directions of noises propagating from the electronic component 201, the leakage of the noises can be prevented.

Fourth Embodiment

Figure 18:
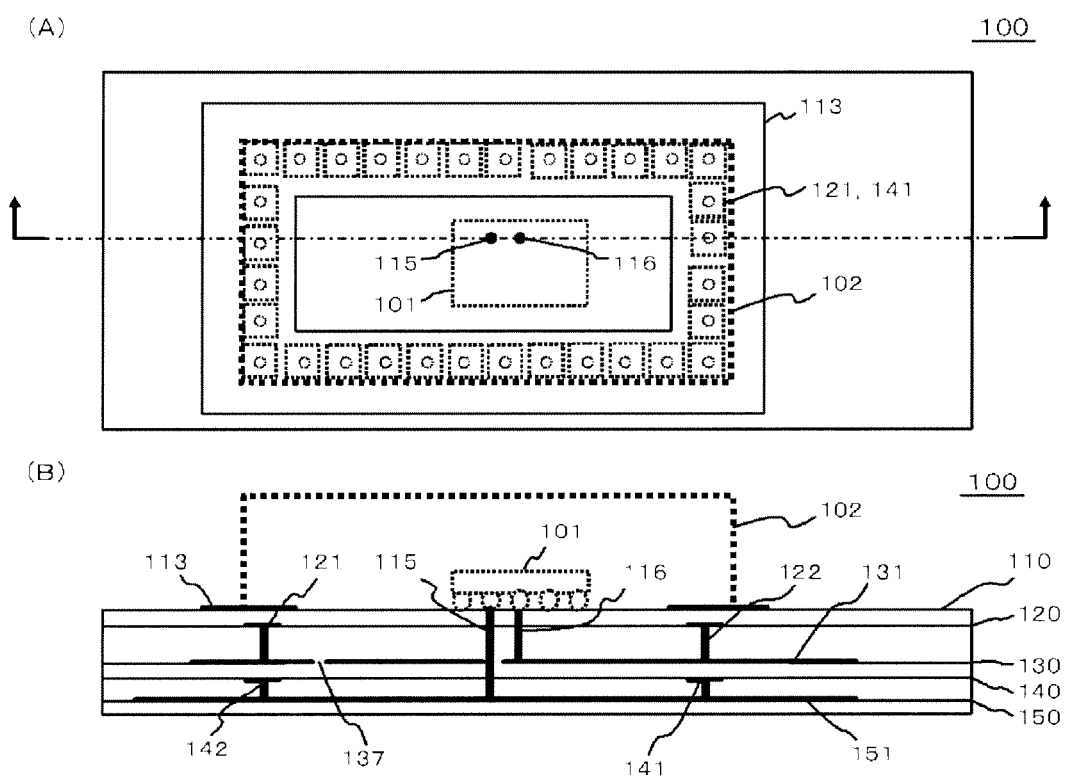
FIG. 18 represents a top view and a cross-sectional view of an electronic device according to a fourth embodiment of the present invention.

FIG. 18 represents a top view and a cross-sectional view of a wiring board 100 according to a fourth embodiment of the present invention. Described in more detail, FIG. 18(A) is a top view of the wiring board 100, and FIG. 18(B) is a cross-sectional view of the wiring board 100 that is taken along a cross-section line represented in FIG. 18(A). While the connection member 122 connects the conductive body element 121 and the metal cap pad 113 in the wiring board 100 described in the first embodiment, in the wiring board 100 according to this embodiment, the connection member 122 connects the conductive body element 121 and the power source plane 131, which is different from the wiring board of the first embodiment. The other constituent elements are the same as those of the first embodiment, and detailed description thereof will not be presented here.

By configuring as described above, the conductive body element 121 is located between the metal cap pad 113 and the power source plane 131 and faces the metal cap pad 113. The conductive body element 121 configures a unit cell having the EBG structure of a so-called mushroom type together with the metal cap pad 113, the power source plane 131, and the connection member 122. Described in more detail, the connection member 122 corresponds to the shaft portion of the mushroom and forms inductance. On the other hand, the conductive body element 121 corresponds to a head portion of the mushroom and forms capacitance between the conductive body element 121 and the opposing metal cap pad 113.

The EBG structure of the mushroom type can be represented by an equivalent circuit in which parallel flat plates are shunt with a serial resonance circuit that is configured by the above-described capacitance and the above-described inductance, and the resonant frequency of the above-described serial resonant circuit provides the center frequency of the band gap. Accordingly, by increasing the capacitance by approaching the conductive body element 121 to the opposing metal cap pad 113, the frequency of the band gap zone can be configured to be low. However, even in a case where the conductive body element 121 is not configured to approach the opposing metal cap pad 113, there is no influence on the essential effect of the present invention.

As above, while the embodiments of the present invention have been described with reference to the drawings, the embodiments are examples of the present invention, and various configurations other than those described above may be employed.

For example, in the above-described embodiments, a configuration has been described in which there is one or two layers in which the conductive body elements are arranged, a modified example in which the conductive body elements are arranged in three or more layers may be configured. In addition, while a configuration has been described in which there is a single layer in which the ground plane extends or in which the power source plane extends, a modified example in which at least one of them extends in a plurality of layers may be configured.

Furthermore, in the above-described embodiment, although the ground plane is illustrated in the drawings so as to extend inside of the wiring board, the ground plane may extend to the rear face of the face on which the electronic component is mounted so as to be exposed.

In the second embodiment, although the conductive body elements 231 and 251 are connected to the metal cap pad 213 and the ground plane 271 through the connection member 212, the connection of the conductive body elements 231 and 251 are not limited thereto. For example, the conductive body elements 231 and 251 may be connected to the power source plane 241 (or 242 or 243) or may be connected to another layer.

In addition, it is apparent that the above-described embodiments and modified examples thereof may be combined together in a range in which the contents are not contradictory.

This application is based upon and claims the benefit of priority of the prior Japanese Patent Application No. 2010-051083, filed on Mar. 8, 2010, the entire contents of which are incorporated herein by reference.

The invention claimed is:

1. An electronic device comprising: a wiring board that includes a plurality of layers;
an electronic component that is mounted on one face of the wiring board; and
a metal cap that covers the electronic component, wherein the wiring board includes:
a first conductive body that is located on the one face, is arranged so as to surround the electronic component, and is connected to an end portion of the metal cap;
a second conductive body that is located in a first layer, is connected to the electronic component through a first connection member, and has a gap; a third conductive body that is located in a second layer facing the one face through the first layer and is connected to the electronic component through a second connection member; and a plurality of fourth conductive bodies that are repeatedly arranged so as to surround the first connection member, the second connection member and the gap, wherein the second conductive body and the third conductive body extend so as to include at least a part of an area that is surrounded by the plurality of fourth conductive bodies and at least a part of an area facing the plurality of fourth conductive bodies in the plan view. wherein the second conductive body is divided into a plurality of parts so as to be separated away from the gap, wherein there is a plurality of the first connection members, and at least some of the first connection members are connected to the second conductive bodies that are different from each other, and wherein the plurality of fourth conductive bodies is repeatedly arranged so as to surround the first connection members that are connected to the second conductive bodies different from each other.

2. The electronic device according to claim 1,
wherein the fourth conductive bodies are located in a layer that is different from any one of the one face, the first layer, and the second layer, and
wherein the fourth conductive bodies are further connected to the second conductive body or at least one of the first conductive body and the third conductive body.

3. The electronic device according to claim 2,
wherein the fourth conductive bodies are located between the first conductive body and the second conductive body, are connected to the second conductive body, and face the first conductive body.

4. The electronic device according to claim 1,
wherein the fourth conductive body connects the first conductive body, the third conductive body, and the fourth conductive body through a through via that vertically passes through the one face.

5. The electronic device according to claim 4,
wherein the fourth conductive bodies are located at least between the first conductive body and the second conductive body or between the second conductive body and the third conductive body, and
wherein the fourth conductive body faces an opening through which the through via disposed in the second conductive body passes and is larger than the opening.

6. The electronic device according to claim 5,
wherein the fourth conductive bodies are located either between the first conductive body and the second conductive body or between the second conductive body and the third conductive body.

7. The electronic device according to claim 1, further comprising a fifth conductive body that is located in a third layer that faces the second layer through the first layer and is connected to the third conductive body through the first connection member or the second connection member,
wherein the fifth conductive body extends so as to include at least a part of the area that is surrounded by the plurality of fourth conductive bodies and at least a part of the area that faces the plurality of fourth conductive bodies in the plan view.

8. The electronic device according to claim 1,
wherein the third conductive body is a ground plane that supplies a reference electric potential to the electronic component.

9. The electronic device according to claim 1,
wherein the first conductive body, the second conductive body, the third conductive body, and the fourth conductive body configure at least a part of an electronic band gap structure, and
wherein the electronic band gap structure includes a frequency of a noise that is generated by the electronic component in a band gap zone.

10. A wiring board comprising:
a first conductive body that is located on one face, is arranged so as to surround a mounting area of an electronic component, and is connected to an end portion of a metal cap;
a second conductive body that is located in a first layer, is connected to the electronic component through a first connection member, and has a gap;
a third conductive body that is located in a second layer facing the one face through the first layer and is connected to the electronic component through a second connection member; and
a plurality of fourth conductive bodies that are repeatedly arranged so as to surround the first connection member, the second connection member and the gap,
wherein the second conductive body and the third conductive body extend so as to include at least a part of an area that is surrounded by the plurality of fourth conductive bodies and at least a part of an area facing the plurality of fourth conductive bodies in the plan view.

11. A method of shielding a noise that is used for shielding the noise that is generated by an electronic component mounted on one face of a wiring board, the method comprising:
shielding a noise propagating from the electronic component to the air using the metal cap that covers the electronic component;
shielding a noise propagating above the surface of one face using a first conductive body that is located on the one face, is arranged so as to surround the electronic component, and is connected to an end portion of a metal cap;
shielding a noise propagating between a second conductive body that is located in a first layer, is connected to the electronic component through a first connection member, and has a gap and a third conductive body that is located in a second layer facing the one face through the first layer and is connected to the electronic component through a second connection member, in an area in which a plurality of fourth conductive bodies that are repeatedly arranged so as to surround the first connection member, the second connection member, and the gap face at least one of the second conductive body and the third conductivity body; and
shielding a noise that propagates between the second conductive body and the third conductive body and further leaks from the gap using an area in which the plurality of fourth conductive bodies face at least one of the first conductive body and the second conductive body or the metal cap.

* * * * *